United States Patent
Mc Connell et al.

(10) Patent No.: US 6,216,248 B1
(45) Date of Patent: Apr. 10, 2001

(54) INTEGRATED MEMORY

(75) Inventors: Roderick Mc Connell; Detlev Richter, both of München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/243,296

(22) Filed: Feb. 2, 1999

(30) Foreign Application Priority Data

Feb. 2, 1998 (DE) .............................................. 198 04 035

(51) Int. Cl.[7] .................................................. H03M 13/00
(52) U.S. Cl. ........................... 714/763; 714/766; 714/746
(58) Field of Search ................................... 714/763, 766, 714/752, 746, 718

(56) References Cited

U.S. PATENT DOCUMENTS

| 4,319,356 | * | 3/1982 | Kocol et al. . |
| 4,528,666 | | 7/1985 | Cline et al. . |
| 5,493,574 | | 2/1996 | McKinley . |
| 5,497,376 | | 3/1996 | Kopp . |
| 5,958,079 | * | 9/1999 | Yoshimura .......................... 714/766 |

FOREIGN PATENT DOCUMENTS

| 4329012A1 | 3/1995 | (DE) . |
| 0 184 737 A2 | 6/1986 | (EP) . |

OTHER PUBLICATIONS

Hideto Hidaka et al.: "The Cache DRAM Architecture: A DRAM with an On–Chip Cache Memory", IEEE Micro, vol. 10, No. 2, Apr. 1, 1990, pp. 14–25.

* cited by examiner

*Primary Examiner*—Phung M. Chung
(74) *Attorney, Agent, or Firm*—Herbert L. Lerner; Laurence A. Greenberg; Werner H. Stemer

(57) ABSTRACT

An integrated memory has a first and a second mode of operation as well as a first memory area and a second memory area. The first memory area is used to store useful data in both modes of operation. The second memory area is used in the first, but not in the second, mode of operation to store error correction data for the useful data which are to be stored in the first memory area. In the first mode of operation, the memory thus has an error correction function that is deactivated during the second mode of operation.

7 Claims, 1 Drawing Sheet

INTEGRATED MEMORY

BACKGROUND OF THE INVENTION

Field of the Invention

The invention relates to an integrated memory having an error correction function.

An error correction function for integrated memories (such as dynamic memories, DRAMs) is produced using so-called error correction codes (ECC). In the simplest case, a so-called parity check is carried out. Therefore, for each data word which is to be stored having a number of bits, one or more parity bits are produced and stored in the memory together with the data word. When the data word is read from the memory, the parity bits stored with it are evaluated, as a result of which, depending on the number of parity bits, one or more bit errors can be detected and also corrected, depending on the error correction code used. A simple and widely used error correction code is the Hamming code. Memories equipped with such an error correction function require additional storage space for storing the parity bits.

Hence, there are two types of memories. First, there are memories which are not provided with any error correction function and in which, accordingly, the storage requirement per data word corresponds exactly to the number of bits per data word. Second, there are memories that have an error correction function and have a storage requirement per data word that is increased by the parity bits, but which allow the correction of errors occurring during storage. The former memories are suitable for storing useful data that are insensitive to errors, such as audio data. The latter memories are suitable for applications in which the absence of errors is very important, as is the case of program memories, for example.

SUMMARY OF THE INVENTION

It is accordingly an object of the invention to provide an integrated memory that overcomes the above-mentioned disadvantages of the prior art devices of this general type, which has an error correction function and can be optimized for storing data which are sensitive and insensitive to errors.

With the foregoing and other objects in view there is provided, in accordance with the invention, an integrated memory, including: a first and a second mode of operation; at least one first memory area for storing useful data in both the first and the second mode of operation; at least one second memory area for storing error correction data associated with the useful data stored in the at least one first memory area during the first mode of operation but not during the second mode of operation; and an error correction unit for producing and evaluating the error correction data stored in the at least one second memory area, the error correction unit activated during the first mode of operation and deactivated during the second mode of operation.

The integrated memory has two modes of operation and at least two memory areas. The first memory area is used to store useful data in both modes of operation. Useful data are the bits of a data word which are to be stored, excluding additional error correction bits or parity bits. The second memory area is used in the first, but not in the second, mode of operation to store error correction data for useful data which are to be stored in the first memory area. In the first mode of operation, the memory thus has an error correction function which assigns error correction data (error correction bits or parity bits), which are to be stored in the second memory area, to the useful data, which are to be stored in the first memory area. In the second mode of operation, the useful data are stored in the first memory area without additional error correction data being stored in the second memory area.

Hence, in the second mode of operation, the error correction function of the memory is deactivated. In the first mode of operation, the memory is therefore suitable for storing useful data for which a high level of error immunity is important, as is the case with program data, for example. In the second mode of operation, the memory is preferably suitable for the type of data for which a high level of error immunity is not important, as is the case with audio data, for example. In terms of obtaining an advantage, the second memory area should be dimensioned such that, in the first mode of operation, it can hold all the error correction data assigned to the useful data in the first memory area. The second memory area will therefore usually be smaller than the first memory area.

The integrated memory according to the invention may, for example, be a DRAM, an SRAM, an EPROM or any other desired type of integrated memory.

The memory also has an error correction unit which is used to produce and evaluate the error correction data which are to be stored in the second memory area. The error correction unit is activated only in the first, but not in the second, mode of operation. Therefore, the error correction unit carries out the error correction function only in the first mode of operation.

According to a first embodiment of the invention, the second mode of operation is an energy-saving mode of operation in which the second memory area is deactivated. In this instance, "deactivated" means that the current consumption of the second memory area is reduced or is even zero. The deactivation is possible because the second memory area is not required for storing error correction data in the second mode of operation. In the second mode of operation, such a memory is suitable for storing data that are not sensitive to errors, while at the same time having lower current consumption than in the first mode of operation. Conventional memories have either no error correction function at all and therefore cannot be used for storing data which are sensitive to errors, or else they have an error correction function which is permanently activated, so that their current consumption is relatively high, even when storing data which are not sensitive to errors and do not require error correction.

According to a second embodiment of the invention, the second memory area is used to store useful data in the second mode of operation, in which it does not store any error correction data. Therefore, in the second mode of operation, useful data can be stored both in the first and in the second memory area. Hence, in the second mode of operation, there is a greater storage capacity available than in the first mode of operation. Consequently, more useful data can be stored in the memory in the second mode of operation than in the first mode of operation, provided that data that are insensitive to errors are being dealt with. In conventional memories with or without an error correction function, the storage capacity is always the same, regardless of whether data that are sensitive or insensitive to errors are to be stored.

Depending on the embodiment, the memory according to the invention thus affords the option either of altering the current consumption of the memory or of having a storage capacity of variable size available, depending on the type of data to be stored or the desirable level of error immunity.

The two memory areas can either be spatially separate from one another, for example by being constituent parts of different memory cell arrays or memory blocks, or they may be disposed concatenated within the same memory cell array or memory block.

According to one development, the memory has a test unit to test the first memory area for storage errors and to define the mode of operation of the memory, depending on the test result. During operation of the memory, the test unit can, for example, test the first memory area and activate the error correction function by changing over from the second to the first mode of operation only if storage errors actually occur.

This has the advantage that, if no storage errors are present, the memory is operated in the second mode of operation, in which, as explained, power consumption can be lower than in the first mode of operation, for example.

Alternatively, a changeover between the modes of operation can also take place by a control signal supplied to the memory externally. The user of the memory can then choose the mode of operation according to his needs.

By virtue of the fact that the error correction function, which may also be carried out separately for each of the first memory areas, for example, is turned on and off, the invention enables flexible use of the memory for a variety of applications. Hence, the error correction function can be turned off for those first memory areas in which only useful data that are insensitive to errors, such as audio data, are to be stored. Whereas the error correction function needs to be activated for those first memory areas in which useful data that are sensitive to errors, such as program data, are to be stored.

It has hitherto been necessary to use a complex and laborious test method to test memories which are provided both for storing data that are sensitive to errors as well as for storing data that are insensitive to errors, but which do not have an error correction function, for the absence of errors both as regards hard storage errors (hard errors, hardware errors) and as regards soft storage errors (soft errors, do not occur on each memory access). Testing soft errors is much more complex than testing hard errors. The invention makes it possible to subject the memory merely to a short test, following manufacture, for hard storage errors, so that up to 80% of the test time and test costs can be saved. If the memory is then later intended to be used to store data that are sensitive to errors, it is changed to the first mode of operation. If it is intended only to store data that are insensitive to errors, soft errors can be tolerated and the memory can be operated in the second mode of operation. In this instance, the user of the memory can himself decide the mode of operation in which the memory should be operated. Furthermore, the configuration may be such that the mode of operation is changed during operation of the memory, depending on the type of data that are currently to be stored.

Other features which are considered as characteristic for the invention are set forth in the appended claims.

Although the invention is illustrated and described herein as embodied in an integrated memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
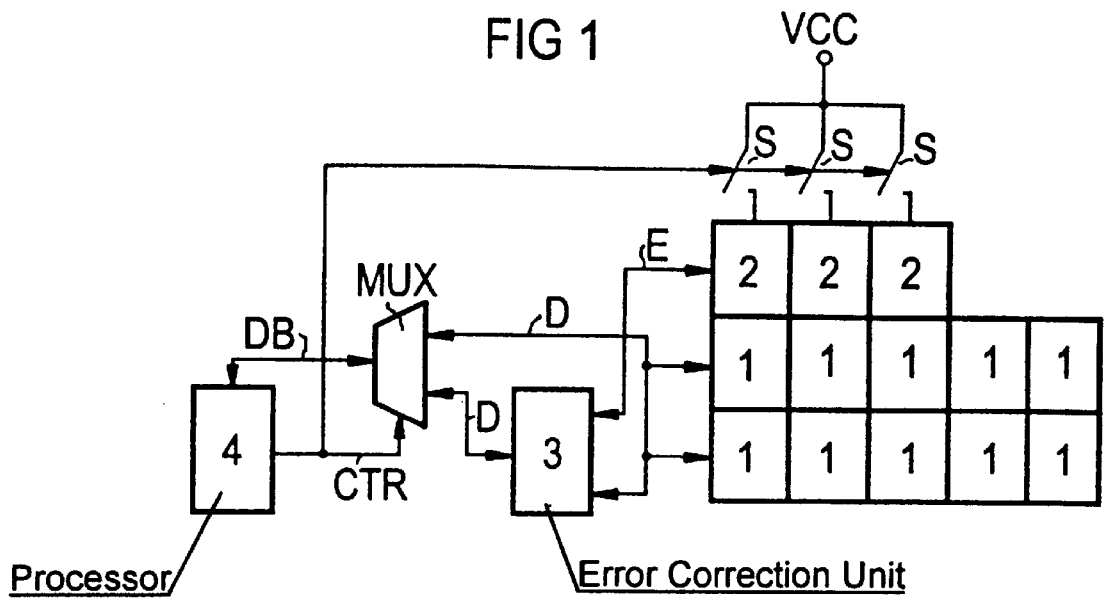
FIG. 1 is a diagrammatic block diagram of a first exemplary embodiment of an integrated memory with an energy-saving mode of operation according to the invention.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of the integrated memory according to the invention, which is a DRAM and has first memory areas 1 and second memory areas 2 in the form of memory blocks. The first memory areas 1 are used both in a first and in a second mode of operation of the memory to store useful data transferred from a processor 4 via a data bus DB. The second memory areas 2 are used only in the first mode of operation to store error correction data assigned to the useful data stored in the first memory areas 1. In the second mode of operation, the second memory areas 2 are not used to store error correction data, but are deactivated. By opening switches S which are connected to a supply potential VCC for the memory, the second memory areas 2 are disconnected from the supply potential VCC in the second mode of operation, so that their current consumption is subsequently zero. The second mode of operation is therefore an energy-saving mode of operation in this exemplary embodiment of the invention.

In other embodiments, the energy-saving mode of operation does not require the second memory area to be disconnected from the supply voltage. Instead, in a DRAM, for example, memory location contents can be prevented from being refreshed in the second mode of operation. This also reduces the current consumption.

Each of the memory areas 1, 2 has a multiplicity of memory cells for storing one bit each of the useful and error correction data, respectively. The memory cells in the memory are disposed in the form of a matrix and are addressed using row and column decoding (not shown in FIG. 1), as is customary in conventional memories.

Furthermore, the memory in FIG. 1 has an error correction unit 3 for producing the error correction data which are to be stored in the second memory areas 2 in the first mode of operation, and for evaluating the error correction data when the corresponding useful data are read from the first memory areas 1. In the first mode of operation, the error correction unit 3 receives useful data D located on the data bus DB via a multiplexer MUX. The error correction unit 3 produces associated error correction data E using a suitable error correction code (such as the Hamming code), writes the error correction data E to one of the second memory areas 2 and writes the associated useful data D to one of the first memory areas 1. When the useful data D are read from one of the first memory areas 1, the error correction unit 3 simultaneously reads the error correction data E associated with the useful data D from the appropriate second memory area 2. The error correction unit 3 subsequently carries out a check of the useful data D for bit errors, on the basis of the error correction data E, and corrects the useful data D if necessary. It then transfers the (possibly corrected) useful data D to the data bus DB via the multiplexer MUX.

In the second mode of operation, the second memory areas 2 are deactivated and the useful data D are written directly from the data bus DB to one of the first memory areas 1 via the multiplexer MUX, bypassing the error correction unit 3. The latter is also bypassed when the useful data D are read from the first memory areas 1 in the second mode of operation. Hence, the error correction unit is activated only in the first mode of operation and is deactivated in the second mode of operation.

In the exemplary embodiment shown, the useful data D are transferred between the processor 4 and the multiplexer MUX by the data bus DB. In this configuration, the processor 4 can be either a constituent part of the same integrated circuit as the components already mentioned, or can be disposed on a separate integrated circuit. The processor 4 is connected to the multiplexer MUX and to the switches S by a control line CTR. The processor 4 uses this control line CTR to control the mode of operation in which the memory is working. If the control line CTR is at a high potential, the memory is working in the first mode of operation. In the first mode of operation the switches S are closed and the multiplexer MUX transfers useful data D via the error correction unit 3 from and to the first memory areas 1, while the error correction unit 3 transfers the error correction data E from and to the second memory areas 2. In the second mode of operation, the control line CTR is at a low potential, the switches S are open and the multiplexer MUX transfers the useful data D from and to the first memory areas 1, bypassing the error correction unit 3. In the second mode of operation, the error correction unit 3 does not transfer any error correction data E from and to the second memory areas 2.

The exemplary embodiment shown is based on the processor 4 initially operating the memory in the second mode of operation with the low current consumption and carrying out a memory test on the first memory areas 1 at regular intervals. The memory test is carried out by writing test data to the first memory areas 1, and subsequently reading the data. The test data items that are read are compared with those that are written. In doing this, if the processor 4 establishes that there are storage errors, it changes the memory from the second to the first mode of operation using the control line CTR, as a result of which the second memory areas 2 and the error correction function are activated. In this case, the processor 4 acts as a test unit.

In other embodiments of the invention, the test unit function which has just been outlined is not used, and the mode of operation is specified (possibly by the user of the memory) depending on the sensitivity to errors of the data which are to be stored. For this purpose, the control line CTR can be connected to the memory, e.g. bypassing the processor 4 as well. The control line CTR can then be used to set the desired mode of operation externally.

Figure 2:
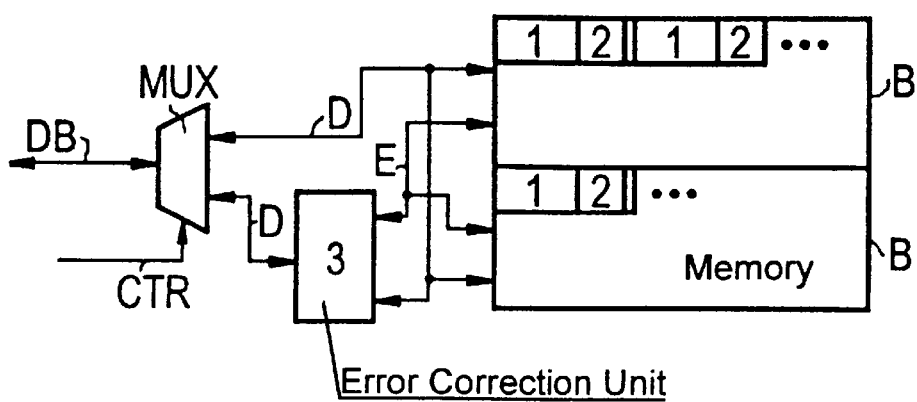
FIG. 2 is a block diagram of a second exemplary embodiment, in which a storage capacity of the memory is different in each of two modes of operation.

FIG. 2 shows a second exemplary embodiment of the integrated memory according to the invention, which differs from the exemplary embodiment in FIG. 1 in that the first 1 and the second 2 memory areas are now not spatially separate from one another, but rather are disposed concatenated within memory blocks B. Therefore, in the first mode of operation, the useful data that are to be stored in the first memory areas 1 are directly adjacent to the error correction data associated with them in the second memory areas 2. In this exemplary embodiment, the data bus DB has a width of 40 bits, but only 32 of these bits are used in the first mode of operation. Each of the first memory areas 1 can hold one data word of useful data having 32 bits. Each of the second memory areas 2 can hold 8 bits of error correction data. Therefore, to store 32 bits of useful data, 40 bits of storage space are required in the first mode of operation. In the second mode of operation, which in this exemplary embodiment, unlike that shown in FIG. 1, is not an energy-saving mode of operation, the second memory areas 2 are also used to store useful data. Data words with a width of 40 bits can then be written to and read from the memory via the data bus DB. Hence, the data bus DB and the internal data buses have 40 lines, of which only 32 are used in the first mode of operation.

A modification of the exemplary embodiment shown in FIG. 2 is based on only 32-bit words of useful data being stored and read again in the second mode of operation. With these words, the memory cell which stores the respective first bit of the data word is shifted in the second mode of operation with respect to the first mode of operation. The data bus DB and the external buses are then only 32 bits wide. It is then possible to store a larger number of data words each having a width of 32 bits. In the exemplary embodiment shown in FIG. 2, the number of data words remains constant, however, but the data word width in the second mode of operation is greater than in the first mode of operation.

Another exemplary embodiment of the invention may be based on a concatenated configuration of the first and second memory areas 1, 2 (as shown in FIG. 2), the second memory areas 2 being deactivated in the same way as has been explained with the aid of FIG. 1. Furthermore, with a spatially separate configuration of the first and second memory areas (as in FIG. 1), it is possible to dispense with the energy-saving deactivation of the second memory areas 2 in the second mode of operation and use the second memory areas 2 to store useful data, as has been explained with the aid of FIG. 2. Since the first and second memory areas shown in FIG. 1 are each memory blocks having the same storage capacity, the provision of ten first memory areas 1 and three second memory areas 2 would result in a 30% increase in the storage capacity available for useful data in the second mode of operation over that in the first mode of operation.

We claim:

1. An integrated memory, comprising:
   a first and a second mode of operation;
   at least one first memory area for storing useful data in both said first and said second mode of operation;
   at least one second memory area for storing error correction data associated with the useful data stored in said at least one first memory area during said first mode of operation but not during said second mode of operation; and
   an error correction unit for producing and evaluating the error correction data stored in said at least one second memory area, said error correction unit activated during said first mode of operation and deactivated during said second mode of operation.

2. The memory according to claim 1, wherein said second mode of operation is an energy-saving mode of operation in which said at least one second memory area is deactivated.

3. The memory according to claim 1, wherein said at least one second memory area stores the useful data in said second mode of operation.

4. The memory according to claim 1, wherein said at least one first memory area is spatially separate from said at least one second memory area.

5. The memory according to claim 1, wherein said at least one first memory area is disposed in a concatenated configuration with said at least one second memory area.

6. The memory according to claim 1, including a test unit for testing said at least one first memory area for storage errors and for defining a mode of operation in dependence on a test result of the testing.

7. The memory according to claim 1, including a connection terminal for applying a control signal controlling a selection of one of said first mode of operation and said second mode of operation.

* * * * *